(12) United States Patent
Tan

(10) Patent No.: US 7,924,036 B2
(45) Date of Patent: Apr. 12, 2011

(54) CONTACTOR ASSEMBLY FOR INTEGRATED CIRCUIT TESTING

(75) Inventor: Yin Leong Tan, Singapore (SG)

(73) Assignee: Test Max Manufacturing Pte Ltd, Singapore (SG)

( * ) Notice: Subject to any disclaimer, the term of this patent is extended or adjusted under 35 U.S.C. 154(b) by 0 days.

(21) Appl. No.: 12/269,894

(22) Filed: Nov. 13, 2008

(65) Prior Publication Data

US 2009/0153164 A1  Jun. 18, 2009

(30) Foreign Application Priority Data

Dec. 17, 2007 (SG) ............................... 200718815-4

(51) Int. Cl.
*G01R 31/20* (2006.01)
(52) U.S. Cl. .............................. 324/754.07; 324/754.03
(58) Field of Classification Search ............... 324/158.1, 324/754–765
See application file for complete search history.

(56) References Cited

U.S. PATENT DOCUMENTS

| | | | | |
|---|---|---|---|---|
| 4,175,253 A * | 11/1979 | Pitegoff | | 324/704 |
| 5,784,262 A * | 7/1998 | Sherman | | 361/777 |
| 6,330,164 B1 * | 12/2001 | Khandros et al. | | 361/760 |
| 6,529,011 B1 * | 3/2003 | Okubo | | 324/537 |
| 6,564,986 B1 * | 5/2003 | Hsieh | | 228/103 |
| 6,636,057 B1 * | 10/2003 | Uchikura | | 324/754 |
| 6,724,205 B1 * | 4/2004 | Hayden et al. | | 324/754.07 |
| 6,774,649 B2 * | 8/2004 | Hartmann | | 324/754 |
| 6,788,090 B2 * | 9/2004 | Aihara | | 324/765 |
| 6,859,054 B1 * | 2/2005 | Zhou et al. | | 324/754 |
| 7,088,118 B2 * | 8/2006 | Liu et al. | | 324/754 |
| 7,242,202 B2 * | 7/2007 | Groshong et al. | | 324/754 |
| 7,271,606 B1 * | 9/2007 | Tang et al. | | 324/761 |
| 7,456,646 B2 * | 11/2008 | Hayden et al. | | 324/762 |
| 7,586,317 B2 * | 9/2009 | Komatsu et al. | | 324/754 |
| 2005/0280428 A1 * | 12/2005 | Ishikawa et al. | | 324/754 |
| 2008/0042673 A1 * | 2/2008 | Hayden et al. | | 324/754 |

* cited by examiner

*Primary Examiner* — Ha Tran T Nguyen
*Assistant Examiner* — Richard Isla Rodas
(74) *Attorney, Agent, or Firm* — Pyprus Pte Ltd

(57) ABSTRACT

The present invention provides a contactor assembly (100, 200,300) for testing of semiconductor devices (DUT). The contactor assembly (100,200,300) includes a plurality of probes (20,22,24), a contactor holder (150,350) and a cover (180,280) shaped and dimensioned to fit on the contactor holder (150,350). The contactor holder (150,350) is a stack of laminates. A top laminate (156,256) of the contactor holder (150,350) has apertures (158,258). A contact probe (22) is seen through one aperture (158,258). On a rear face of the cover (180,280), there is at least one conductive pad (186) in register with an aperture (158,258). Each aperture (158,258) is operable to house a surface-mount electric component (160), such as a resistor, capacitor or inductor, and a conductive compressive element (162). In another embodiment, a front side of a cover (280) has a connector (285) in electrical communication with a conductive pad (186). In use, a signal in one probe (22) is operable to be: coupled to a signal in another probe; filtered from a separate probe; or compensated for impedance, capacitance or inductance; such coupling, filtering or compensating is made possible by series and/or parallel connection of the electric component (160).

20 Claims, 3 Drawing Sheets

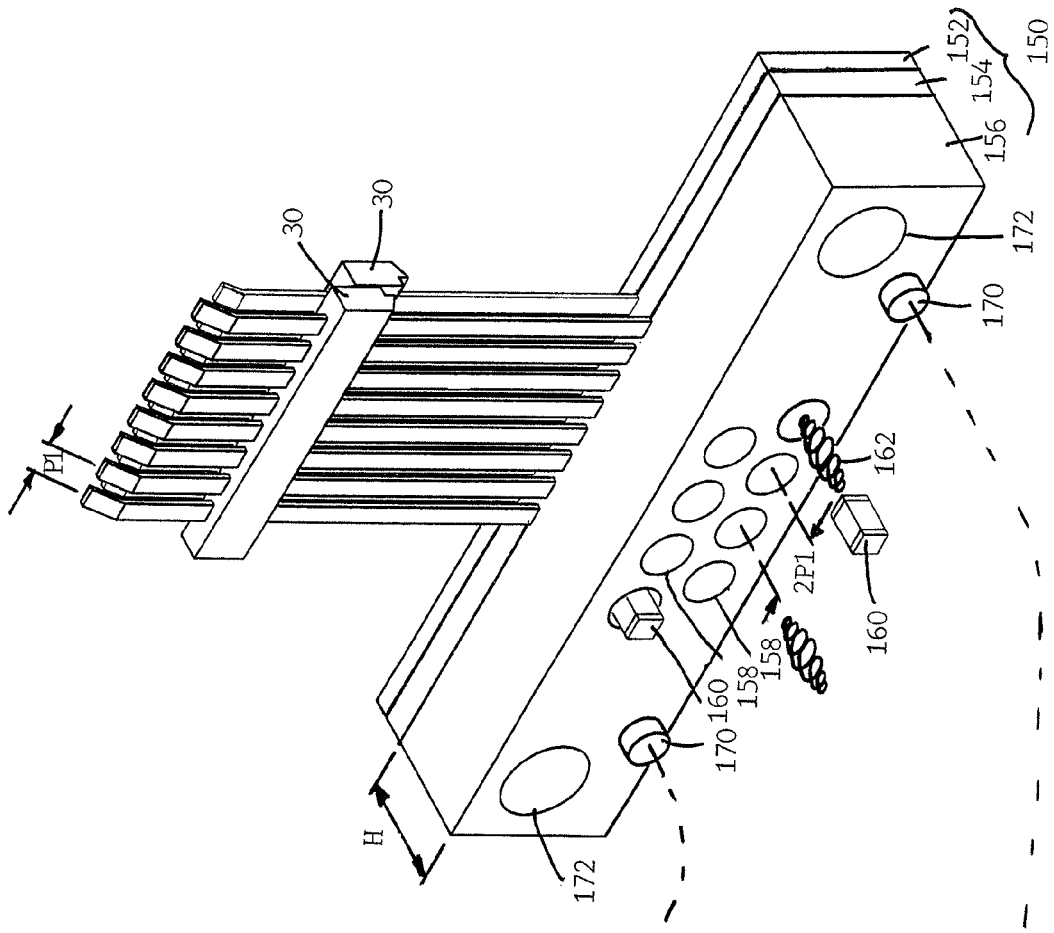
FIG. 2B
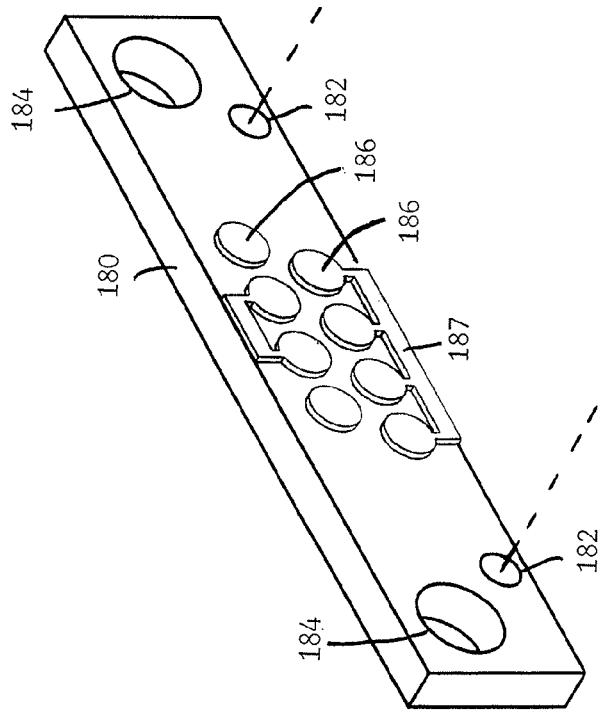

CONTACTOR ASSEMBLY FOR INTEGRATED CIRCUIT TESTING

FIELD OF THE INVENTION

The present invention relates to a contactor assembly for an integrated circuit testing device.

BACKGROUND

In the manufacture of integrated circuit devices, it is desirable to test each device before it is shipped and/or assembled onto a printed circuit board of a large and expensive equipment. Due to production requirements, handling and testing of such integrated devices are carried out in extremely high rates, for instance, in excess of about 5000 devices per hour per machine. When operating at such speeds, testing of the integrity and functionality of each device must be accomplished within a fraction of a second, typically less than 300 milliseconds. In addition, each test should be accurate and reliable. To maintain a predetermined quality assurance, the lower the reliability of a test, the greater is the reject rate; as a result, some devices in working condition may be rejected as defective.

Typically, in a semiconductor test, a pair of bifurcated Kelvin contacts 20 is brought to contact each terminal 12 of the semiconductor device or device under test (DUT). Each pair of bifurcated Kelvin contacts 20 has a contact probe 22 and sense probe 24. Each probe 22,24 is a slender strip of resilient and highly electrical conductive material, and establishes electrical connection between the DUT and a test circuitry or tester 90; the contact probe 22 carries a signal for testing the DUT, whilst the sense probe 24 has high input impedance and is used for sensing a voltage on the same terminal 12 of the DUT. In use, the sense probe 24 is operable to compensate for the contact resistance between the DUT terminal 10 and the contact probe 22. FIG. 1 shows such a prior art semiconductor testing apparatus 10. As shown in FIG. 1, a probe holder 30 separately holds the contact 22 and sense 24 probes together, while a contactor holder 50 holds all the probes 22,24 together.

During semiconductor device testing, the test signals are applied onto the terminal within a short contact time. As a result, steep step-like voltages and currents are supplied through the contact probe 22 of the bifurcated Kelvin contacts 20. Coupled with relatively long electrical paths between the tester 90 and the DUT, the test signals are distorted by parasitic impedance and inductance along the electrical path and parasitic capacitance between adjacent electrical paths. For example, due to steep step-like current surges through the Kelvin contact probe 22, the reference voltage from the tester 90 is distorted and caused so-called ground noise.

U.S. Pat. No. 6,064,218 assigned to PrimeYield Systems, Inc. discusses a test apparatus for testing a peripherally leaded electric package. The test apparatus includes a contactor, an interface board and test electronics. The contactor includes cantilevered spring contacts and an interposer. The interposer includes a plurality of angled conductors, each conductor for connecting a cantilevered spring contact to a corresponding contact pad disposed on the interface board to complete electrical paths to the test electronics.

Despite development in the field of this invention, it can thus be seen that there exists a need for another contactor assembly system for testing semiconductor devices.

SUMMARY

The following presents a simplified summary to provide a basic understanding of the present invention. This summary is not an extensive overview of the invention, and is not intended to identify key features of the invention. Rather, it is to present some of the inventive concepts of this invention in a generalised form as a prelude to the detailed description that is to follow.

In one embodiment, the present invention provides a contactor assembly. The test assembly comprises: a plurality of contact probes, each probe having a proximal end and a distal end; a probe holder near the proximal end for keeping the plurality of probes in a parallel and spaced apart manner; a contactor holder disposed after the probe holder with respect to the proximal end; wherein the contactor holder comprises a stack made up of a base laminate, a top laminate and a cover shaped and dimensioned to fit with the top laminate, the top laminate having two rows of apertures through its thickness so that each of the plurality of contact probes are seen through the two rows of apertures in a staggered manner; and a rear face of the cover facing the top laminate has at least one conductive pad in register with an aperture on the top laminate; and a load board, wherein the distal ends of the plurality of contact probes are operable to terminate on the load board and the load board is operable to connect to a test circuitry.

In another embodiment, the present invention provides a method of testing a semiconductor device (DUT). In one embodiment, method comprises: contacting two terminals of the DUT separately with a first contact probe and a second contact probe; and connecting an electric component across the first and second probes so that a second signal in the second probe is coupled from a first signal in the first probe, wherein connecting the electric component across the probes is achieved by opening apertures in a contactor holder for housing the electrical component and/or a compressive element, and electrically connecting the electrical component and compressive element through a conductive pad.

In another embodiment, the method of testing a semiconductor device (DUT) comprises: contacting two terminals of the DUT separately with a first contact probe and a second contact probe; and connecting an electric component to the first probe so that a second signal in the second probe is coupled in series from a first signal in the first probe, wherein connecting the electric component to the probes is achieved by opening apertures in a contactor holder, with each aperture being operable to house the electrical component and a compressive element, and electrically connecting the electrical component and compressive element through a conductive pad and a connector.

In another embodiment, each aperture is dimensioned to house a surface-mount resistor, capacitor or inductor and/or a conductive compressive element. Thus, the electric parameter is determined by one or two electric components; in another embodiment, the top laminate comprises a stack of top laminates so that the electric parameter is determined by two or more electric components.

BRIEF DESCRIPTION OF THE DRAWINGS

This invention will be described by way of non-limiting embodiments of the present invention, with reference to the accompanying drawings, in which:

FIG. 2B illustrates an exploded view of a contactor holder;

DETAILED DESCRIPTION

Figure 1:
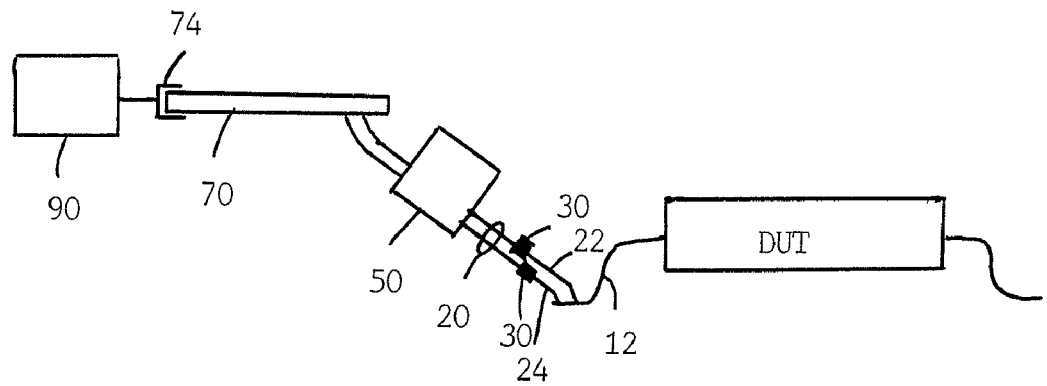
FIG. 1 illustrates a prior art semiconductor testing apparatus.

One or more specific and alternative embodiments of the present invention will now be described with reference to the attached drawings. It shall be apparent to one skilled in the art, however, that this invention may be practiced without such specific details. Some of the details may not be described at length so as not to obscure the invention. For ease of reference, common reference numerals or series of numerals will be used throughout the figures when referring to the same or similar features common to the figures.

Figure 2A:
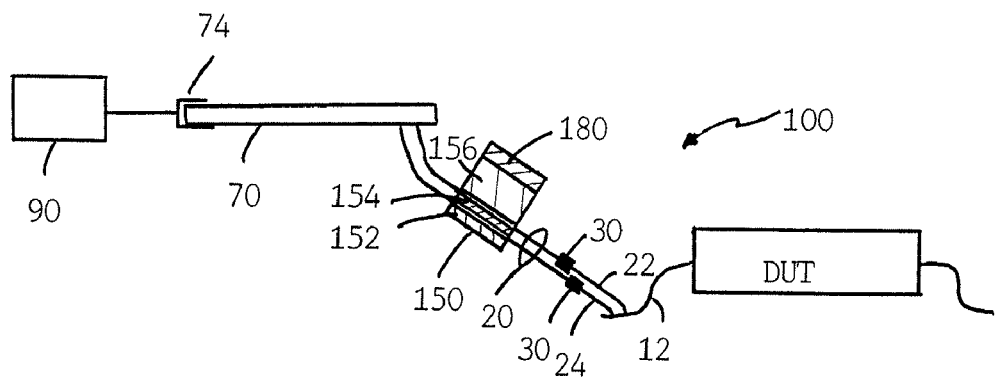
FIG. 2A illustrates a contactor assembly for semiconductor device testing according to an embodiment of the present invention.
Figure 4:
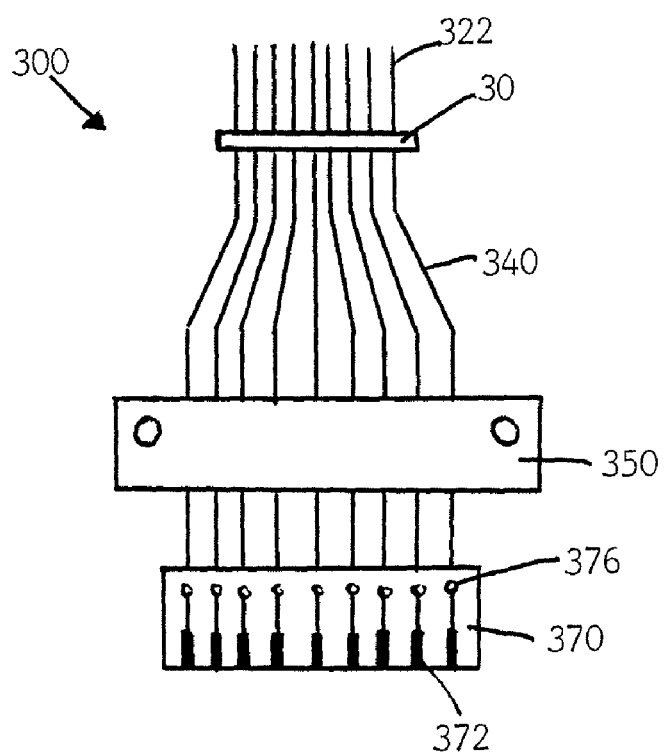
FIG. 4 illustrates a contactor assembly according to yet another embodiment of the present invention.

FIG. 2A shows a semiconductor test contactor assembly 100 according to an embodiment of the present invention. As shown in FIG. 2A, each contactor assembly 100 has a plurality of bifurcated Kelvin contacts 20, a contactor holder 150 and a load board 70. Each of the bifurcated Kelvin contact 20 or probes 22,24 is made of a highly electrical conductive material, such as, beryllium copper plated with gold. The contact probes 22 are held in a substantially parallel manner by a probe holder 30 while the sense probes 24 are also held in a substantially parallel manner by a separate probe holder 30. Both the contact probes 22 and sense probes 24 are parallel and equally pitched, as indicated by P1 in FIG. 2B. The free-ends of the contact probes 22 and sense probes 24 are bent so that when in use, both the respective tips of a Kelvin contact 20 contact a terminal 12 of the DUT. Each probe 22,24 is an integral piece connecting a terminal 12 of the DUT to the load board 70. The load board 70 is a double-sided circuit board; each of the two sides of the load board 70 has copper that is etched and formed with contact fingers 72. The contact fingers 72 are dimensioned and spaced apart for engaging with an external connector 74 for connection to the tester or test circuitry 90. An inside end of each contact finger 72 extends along the respective face of the load board 70 and terminates at a plated through hole (PTH) 76. The PTH 76 extends through a thickness of the load board 70, such that each contact finger 72 on one face of the load board 70 is associated with either the contact probe 22 or the sense probe 24. Each PTH 76 is dimensioned to receive a distal end of each probe 22,24, and each distal end is operable to be soldered in a PTH 76. FIG. 4 illustrates similar contact fingers 372, PTH 376 and load board 370 according to another embodiment of the present invention.

The contactor holder 150 is made up of a stack of three laminates 152,154,156 of an electrical insulator, such as, bakelite or epoxy resin. As shown in FIG. 2A, the sense probes 24 are sandwiched between the base 152 and centre 154 laminates, while the contact probes 22 are sandwiched between the centre 154 and top 156 laminates. In another embodiment, the contact probes 22 are sandwiched between the base 152 and centre 154 laminates, while the sense probes 24 are sandwiched between the centre 154 and top 156 laminates. Removably mounted on the top laminate 156 is a cover 180.

FIG. 2B shows an exploded view of the contactor holder 150 and cover 180. As shown in FIG. 2B, the top laminate 156 has two rows of apertures 158 formed with axes of the apertures parallel to a height of the stacked contacted holder 150. Each aperture 158 opens through the height H of the top laminate 156. As shown in FIG. 2B, the apertures 158 of each row are equally spaced apart with a pitch of twice P1. The apertures 158 in the two rows are offset by P1 such that the contact probes 22 are seen through the apertures 158 in a staggered manner; similarly, the sense probes 24 are seen through the apertures 158 in a staggered manner. Each aperture 158 has a diametrical dimension of less than twice P1 minus the width of one contact probe 22. The height H is dimensioned such that the height H can accommodate a case length of a surface mount resistor, capacitor or inductor 160 and a length of conductive compressive element 162. For example, with a probe pitch P1 of 0.6 mm, a diameter of the aperture 158 of about 1 mm may house a surface-mount capacitor with case size 0603.

In one embodiment, the conductive compressible element 162 is a coiled spring. In another embodiment, the conductive compressible element 162 is a resilient elastomer with an arcuate wire molded therein for electrical conduction; the arcuate wire molded in the resilient elastomer may not substantially add to the inductance as compared to a coiled element. In either embodiment, one type of conductive compressive element 162 has a relatively short length for use with a series resistor, capacitor or inductor 160 disposed in an aperture 158; in another embodiment, another type of conductive compressive element 162 has a free length that is longer than the height H of the top laminate 156. When an electric component is used with a short conductive compressive element 162, a required electric parameter, such as resistance or inductance, is determined by two or more electric components in series, thus providing an electric parameter of higher value, or by two capacitors in series to provide a capacitance of lower value. Thus, by using a top laminate 156 of different heights H or by stacking of additional top laminates 156 together, the contactor assembly 100 of the present invention can accommodate electric components with the required parameter values.

Referring back to FIG. 2B, the top laminate 156 has two dowel pins 170. The top laminate 156 is elongate and each dowel pin 170 is disposed near each of the two ends of the probe assembly. Near each dowel pin 170 is a hole 172. In one embodiment, the hole 172 is dimensioned for receiving a self-tapping screw. In another embodiment, the hole 172 has a threaded nut inserted or molded therein for receiving a machine screw.

Again referring to FIG. 2B, the cover 180 is a plate, which is dimensioned and shaped to fit with the top laminate 156. To fit with the top laminate 156, the cover 180 has two locating holes 182 positioned and spaced apart to engage with the dowel pins 170. In addition, there are two holes 184 in register with the holes 172 on the top laminate 156. Each hole 184 is dimensioned to receive a self-tapping screw or machine screw for securing the cover 180 onto the top laminate 156. On the rear face of the cover 180, i.e. the side facing the laminate 156, there are two rows of conductive pads 186. The two rows of conductive pads 186 correspond to the two rows of apertures 158 on the top laminate 156. Some of the conductive pads 186 are interconnected 187 to each other. In use, the interconnection 187 of the pads, together with a surface mount resistor, capacitor or inductor 160 and/or conductive compressive element(s) 162 allow a contact probe 22 to be electrically connected with another contact probe 22. In one use, the electrical interconnection 187 functions like a jumper; in another use, a signal at a contact probe 22 is coupled to another contact probe 22 through a resistor, capacitor or inductor 160 connected in parallel thereto; the resultant signal may be applied as a forced output signal through the another contact probe 22, for example, for functional check at the tester or test circuitry 90. In another use, an input signal at a contact probe 22 is coupled to another contact probe 22 by filtering through a resistor, capacitor or inductor 160 connected in parallel thereto; the filtered signal may be applied as a forced output signal through the another contact probe 22. In use, there is provided a number of covers 180 with different interconnection 187 of the conductive pads 186 for different ways of coupling or filtering signals between different contact probes 22.

Figure 2C:
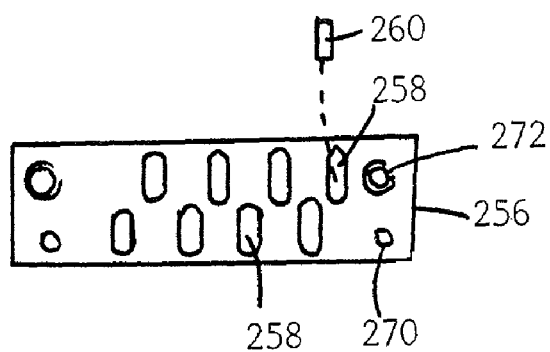
FIG. 2C illustrates a top laminate of a contactor holder according to another embodiment of the present invention.

FIG. 2C shows a top laminate 256 according to another embodiment of the present invention. As shown in FIG. 2C, the top laminate 256 is shaped and dimensioned like the above top laminate 156 except that the apertures 258 are oblong. Preferably, each aperture 258 has its long axis transverse to the long side of the top laminate 256; in other words, the long axis of each aperture 258 is parallel to the length of each contact probe 22 below the top laminate 256. The apertures 258 are suitable for housing a resistor, capacitor or inductor 260 that has a rectangular cross-section, such as case size 1206, 1210 or 1812.

Figure 3:
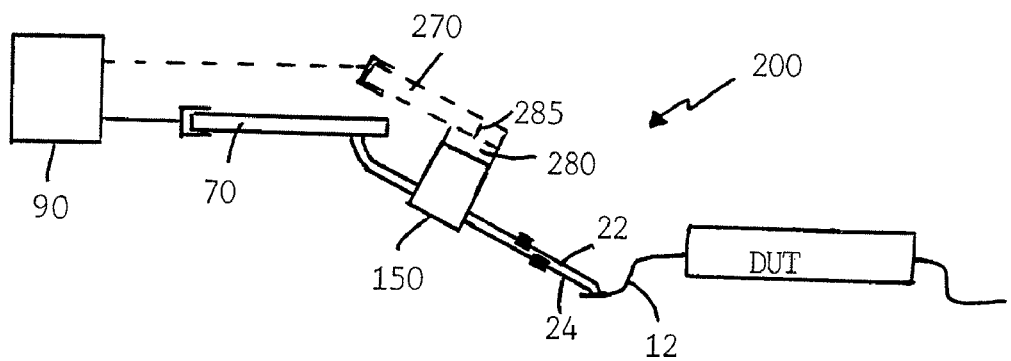
FIG. 3 illustrates a contactor assembly according to another embodiment of the present invention.

FIG. 3 shows a contactor assembly 200 according to another embodiment of the present invention. The contactor assembly 200 is similar to the above contactor assembly 100 except that a top face of cover 280 has a connector 285. In one embodiment, the connector 285 is a pin. In another embodiment, the connector 285 is a socket. Each connector 285 has a conductive pad, which is similar to the above conductive pad 186 of the previous embodiment. The connector 285 may be connected to the tester 90 via a load board 270. Instead of the above parallel connection of the resistor, capacitor or inductor 160, the connector 285 allows series coupling of a signal from another signal or series filtering of a signal to provide another signal to the tester 90; the connector 285 also allows a signal to be tapped from a contact probe 22 which is then passed through a conductive compressive element 162 or resistor/capacitor/inductor 160 to another contact probe 22 or the tester 90, for example, like the above intentionally forced signal to the tester 90; in addition, the connector 285 allows for additional voltage sensing to be tapped from the contact holder of the contactor assembly 200.

In another use, one conductive pad and one connector 285, which are associated with a contact probe 22 that is not electrically connected with another contact probe, allow a resistor, capacitor or inductor 160 to be connected in series with the associated contact probe 22. For example, due to inherent capacitance or inductance in a contact probe, the voltage and/or current in an ac signal inputted to the tester 90 may be out of phase; by providing a series capacitor or inductor 160, the phase difference between the voltage and current is operable to be minimized or corrected before the ac signal is inputted to the tester 90. In other words, the present invention allows some of the signals to be coupled in parallel, in series, or in both parallel and series; some of the signals to be filtered to provide an additional signal; and/or some of the signals to be compensated for impedance, capacitance or inductance.

FIG. 4 shows a contactor assembly 300 according to another embodiment of the present invention. As shown in FIG. 4, the contactor assembly 300 is similar to the earlier embodiments except that some of the bifurcated Kelvin contacts 320 have contact probes 322 and sense probes 324 that are angled 340 so that the a pitch of the probes 322,324 at the contactor holder 350 is larger than the pitch P1 at the contact/ sense tips of the probes. The contactor assembly 300 provides larger apertures 358 on a top laminate 356 (not shown in FIG. 4) of the contactor holder 350; the larger apertures 358 can thus house resistor, capacitor or inductor 360 of larger values and cross-sections. In another embodiment, the pitch of the contact fingers 372 at the load board 370 is larger than the pitch of the probes 322,324 at the contact holder 350.

While specific embodiments have been described and illustrated, it is understood that many changes, modifications, variations and combinations thereof could be made to the present invention without departing from the scope of the invention. For example, screws have been described for removably securing the cover 180 on the contactor holder 150; it is possible that one or two clips is/are instead used for removably attaching the cover onto the contactor holder so that no tools are required for such attachment. Although bifurcated Kelvin contacts have been described, it is not so limited. In addition, the PTH at the distal ends of the Kelvin contacts 20,320 have been described; it is possible that the distal ends of the Kelvin contacts are terminated at a multi-contacts connector for removable connection with the tester.

What is claimed is:

1. A contactor assembly comprising:
    a plurality of contact probes, each probe having a proximal end and a distal end;
    a probe holder near the proximal end for keeping the plurality of probes in a parallel and spaced apart manner;
    a contactor holder disposed after the probe holder with respect to the proximal end; wherein the contactor holder comprises a stack made up of a base laminate, a top laminate and a cover shaped and dimensioned to fit with the top laminate, the top laminate having two rows of apertures through its thickness so that each of the plurality of contact probes are seen through the two rows of apertures in a staggered manner; and a rear face of the cover facing the top laminate has at least one conductive pad in register with an aperture on the top laminate; and
    a load board, wherein the distal ends of the plurality of contact probes are operable to terminate on the load board and the load board is operable to connect to a test circuitry.

2. A contactor assembly according to claim 1, wherein the at least one conductive pad comprises a plurality of conductive pads and some of the conductive pads are interconnected.

3. A contactor assembly according to claim 2, wherein a top face of the cover has a connector in electrical communication with each conductive pad, the top face is opposed to the rear face.

4. A contactor assembly according to claim 3, further comprising another load board connected to said connector.

5. A contactor assembly according to claim 1, wherein each aperture is dimensioned to house a surface-mount resistor, capacitor or inductor and/or a conductive compressive element.

6. A contactor assembly according to claim 1, wherein each contact probe is an integrally formed electrical conductor.

7. A method of testing a semiconductor device under test (DUT), wherein the DUT contains at least two terminals, the method comprising:
    contacting the at least two terminals of the DUT with a contactor assembly, wherein the contactor assembly comprises:
        at least a first contact probe and at least a second contact probe, each probe having a proximal end and distal end;
        a probe holder near the proximal end for keeping the plurality of probes in a parallel and spaced apart manner;
        a contactor holder disposed after the probe holder with respect to the proximal end; wherein the contactor holder comprises a stack made up of a base laminate, a top laminate and a cover shaped and dimensioned to fit with the top laminate, the top laminate having two rows of apertures in a staggered manner; and a rear face of the cover facing the top laminate has at least one conductive pad in register with an aperture on the top laminate; and a load board, wherein the distal ends of the plurality of contact probes are operable to terminate on the load board and the load board is operable to connect to a test circuitry;

wherein the at least two terminals of the DUT are separately contacted with the at least first and second contact probes; and connecting an electric component across the at least first and second contact probes so that a second signal in the at least second contact probe is derived from a first signal in the at least first contact probe, wherein connecting the electric component across the probes is achieved by providing the apertures in the contactor holder, housing the electrical component and a compressive element within at least one of said apertures, and electrically connecting the electrical component and compressive element to the at least second contact probe through the conductive pad of the contactor assembly.

8. A method according to claim 7, wherein each aperture is operable to house two or more electric components so that an electric parameter is determined by two or more said electric components.

9. A method according to claim 7, wherein providing apertures in the contactor holder comprises forming apertures in a top laminate of the contactor holder.

10. A method according to claim 9, wherein the top laminate comprises a stack of top laminates so that an electric parameter is determined by two or more said electric components.

11. A method according to claim 9, wherein the compressive element comprises a short compressive element with respect to a height of the top laminate.

12. A method according to claim 9, wherein the compressive element comprises a long compressive element with respect to a height of the top laminate.

13. A method according to claim 7, wherein the electric component is selected from the following: a resistor, a capacitor and an inductor.

14. A method of testing a semiconductor device under test (DUT), wherein the DUT contains a plurality of terminals, the method comprising:

contacting one of the plurality of terminals of the DUT with a contact probe of a contactor assembly, wherein said contactor assembly comprises a plurality of contact probes, each probe having a proximal end and a distal end;

a probe holder near the proximal end for keeping the plurality of probes in a parallel and spaced apart manner;

a contactor holder disposed after the probe holder with respect to the proximal end; wherein the contactor holder comprises a stack made up of a base laminate, a top laminate and a cover shaped and dimensioned to fit with the top laminate, the top laminate having two rows of apertures in a staggered manner; and a rear face of the cover facing the top laminate has at least one conductive pad in register with an aperture on the top laminate; and a load board, wherein the distal ends of the plurality of contact probes are operable to terminate on the load board and the load board is operable to connect to a test circuitry; and connecting an electric component to the probe so that a second signal in a connector is derived form a signal transmitted in series from the probe, wherein connecting the electric component to the probe is achieved by providing the apertures in the contactor holder, with each aperture being operable to house the electrical component and a compressive element, housing the electrical component and a compressive element with at least one of said apertures, and electrically connecting the electrical component and compressive element to the connector through the conductive pad of the contactor assembly.

15. A method according to claim 14, wherein providing apertures in the contactor holder comprises forming apertures in a top laminate of the contactor holder.

16. A method according to claim 15, wherein the top laminate comprises a stack of top laminates so that an electric parameter is determined by two or more said electric components.

17. A method according to claim 15, wherein the compressive element comprises a short compressive element with respect to a height of the top laminate.

18. A method according to claim 15, wherein the compressive element comprises a long compressive element with respect to a height of the top laminate.

19. A method according to claim 14, wherein the electric component is selected from the following: a resistor, a capacitor and an inductor.

20. A method according to claim 14, further comprises connecting said connector to a test circuitry.

* * * * *